United States Patent [19]

Barry et al.

[11] Patent Number: 5,825,785
[45] Date of Patent: Oct. 20, 1998

[54] SERIAL INPUT SHIFT REGISTER BUILT-IN SELF TEST CIRCUIT FOR EMBEDDED CIRCUITS

[75] Inventors: Robert L. Barry, Essex Junction; John D. Chickanosky, South Burlington; Steven F. Oakland, Colchester; Michael R. Ouellette, Westford, all of Vt.

[73] Assignee: Internaitonal Business Machines Corporation, Armonk, N.Y.

[21] Appl. No.: 653,572

[22] Filed: May 24, 1996

[51] Int. Cl.⁶ .................................................. G01R 31/28
[52] U.S. Cl. ........................................ 371/22.4; 371/22.3
[58] Field of Search ................................. 371/22.4, 22.3, 371/22.5, 27, 22.6

[56] References Cited

U.S. PATENT DOCUMENTS

| | | | |
|---|---|---|---|
| 4,503,537 | 3/1985 | McAnney | 371/22.3 |
| 4,594,711 | 6/1986 | Thatte | 371/22.3 |
| 4,672,307 | 6/1987 | Breuer et al. | 324/73 R |
| 5,090,015 | 2/1992 | Dabbish et al. | 371/22.5 |
| 5,091,908 | 2/1992 | Zorian | 371/21.5 |
| 5,101,409 | 3/1992 | Hack | 371/21.3 |
| 5,138,619 | 8/1992 | Fassang et al. | 371/21.1 |
| 5,173,906 | 12/1992 | Dreibelbis et al. | 371/22.5 |
| 5,184,067 | 2/1993 | Nozuyama | 324/158 R |
| 5,301,156 | 4/1994 | Talley | 365/201 |
| 5,301,199 | 4/1994 | Ikenaga et al. | 371/22.5 |
| 5,383,195 | 1/1995 | Spence et al. | 371/22.5 |
| 5,386,392 | 1/1995 | Cantiant et al. | 365/233 |
| 5,442,640 | 8/1995 | Bardell, Jr. et al. | 371/21.1 |
| 5,442,641 | 8/1995 | Beranger et al. | 371/21.2 |
| 5,485,467 | 1/1996 | Golnabi | 371/22.5 |
| 5,488,615 | 1/1996 | Kunoff et al. | 371/22.4 |
| 5,519,193 | 5/1996 | Freiermuth et al. | 219/678 |
| 5,537,537 | 7/1996 | Fujikawa et al. | 395/183.06 |
| 5,570,374 | 10/1996 | Yau et al. | 371/22.5 |

OTHER PUBLICATIONS

IBM TDB vol. 37 No. 06A Jun. 1994 pp. 611–612 Title: "Read Only Memory Self Method" Ueda et al.
IBM TDB vol. 27 No. 9 Feb. 1985 p. 5338 Title: "Self–Test On A Read–Only Memory"Nuez et al.
IBM Data Book Doc. No. ADC05LDBU–01 pp. 902–908, 1993.

*Primary Examiner*—Hoa T. Nguyen
*Attorney, Agent, or Firm*—Floyd E. Anderson; Mark F. Chadurjian

[57] ABSTRACT

A highly functional built in self test circuit for embedded compiled macros is useful for testing embedded compiled macros having differing parameters. The built in self test circuit receives a scan vector that describes the parameters of the embedded compiled macro that is to be tested. For, example, the number and width of words stored in a read only memory (ROM) are scanned into the built in self test circuit for controlling the test sequences. A state machine within the built in self test circuit cycles through test vector generation, test vector application, data output scanning and compression for signature analysis. Parallel outputs of the embedded compiled devices are serialized so that regardless of the number of outputs, a serial input shift register can be used for signature generation.

16 Claims, 3 Drawing Sheets

SERIAL INPUT SHIFT REGISTER BUILT-IN SELF TEST CIRCUIT FOR EMBEDDED CIRCUITS

FIELD OF THE INVENTION

The present invention relates generally to circuit testing techniques, and more particularly, to improved built-in self test systems for serializing parallel outputs of an embedded circuit for compression into a signature.

BACKGROUND OF THE INVENTION

Integrated circuits continue to advance such that an increasing number of devices, and hence more circuit functions, are integrateable onto a single semiconductor. Not only are the number of circuit functions increasing, but the complexity of the circuits are increasing as well. Testing these integrated circuits having higher device counts and more complex circuits presents an ever increasing challenge to the designers. The functionality of many circuits can be verified using external testers by applying a set of external test signals to the semiconductor and monitoring the outputs therefrom. Memory chips, for example, as commonly packaged in single in line memory modules (SIMMs) are easily verifiable by external testing procedures. Not all circuits, however, can be adequately verified by those external signals supplied by such testers.

Memories that are embedded within other circuits of a semiconductor, for example, are often not amenable to testing via external testers. Testing embedded memories by external means may be inadequate because the input addresses as well as the data outputs are not always directly accessible via the input/output pads of the semiconductor. This is also true of many other embedded circuits. A known solution to this testing problem requires including additional circuits on the semiconductor for the sole purpose of testing, or aiding the testing of the otherwise unverifiable embedded circuits.

Engineers often use built-in self test (BIST) circuits as a solution for improving the testability of circuits not otherwise adequately verifiable via external test machines. A typical BIST solution includes a test pattern generator, for example, a linear feedback shift register connected to provide pseudo random test patterns to be applied to the inputs of the circuit to be tested. Another linear feedback shift register is connected to receive each output response of the circuit being tested for compression with each other output response into a single response known as a signature. This signature can then be compared to the signature expected from a known good circuit. Each embedded circuit tested by a BIST typically requires a custom BIST to be designed for that circuit so that the proper number of inputs are available with the necessary number of test vectors being applied and with the proper number of bits in the signature register to receive each output response. This is especially critical in memories where every address needs to be exercised. Application specific integrated circuits (ASICs) present a particular challenge to testing since semiconductor technology has improved to the point that complete systems that include a microprocessor core and substantial amounts of memory can be readily integrated thereon.

A substantial benefit of designing with ASICs is the ability, using sophisticated computer aided design (CAD) techniques, to quickly define a design using predefined or compiled library elements and realize that design in silicon. Historically a separate BIST has been required for each unique circuit requiring improved testing. Each time such a compiled library element is called for use in the ASIC that requires BIST for testing, then a new BIST is likewise required. The compiled embedded memory provides a good example. Assume that one design requires a 2K read only memory (ROM) having a four bit word length. The BIST would need to address the full 2K of data while monitoring four bits on each read. The ROM could very quickly be recompiled to provide 4K words and an eight bit output. However, now a new BIST must be designed to test the newly compiled ROM which will increase design cycle time, etc. An improved solution would be one that allows a BIST that uses a same physical structure for testing regardless of the parameters of the compiled circuit that must be internally tested, thus improving design cycle times and reducing errors in design by reusing the same BIST macro.

Accordingly it is desired to provide a method and apparatus for testing compiled macros in an integrated circuit, including memories, using a single BIST macro design regardless of the parameters of the compiled macros.

SUMMARY OF THE INVENTION

An object of the present invention is to provide an improved built-in self test design and method for verification of embedded devices or macros.

Another object of the present invention is to provide a single flexible built-in self test macro capable of verifying compiled macros having differing parameters.

Still another object of the present invention is to provide a built-in self test macro that can be re-used to verify differing compiled memory embedded within an integrated circuit whereby the built-in self test macro serializes the memory output for generating a signature.

According to a first embodiment of the present invention, a method for using a built in self test circuit for testing an embedded macro circuit having parallel outputs is presented. The method includes the steps of initializing the electronic device into a test mode of operation and generating a test vector. The test vector is then applied to inputs of the embedded macro circuit causing the embedded macro circuit to generate a response on the parallel outputs. The response from the parallel outputs is loaded into a scan register. Next the response is serially shifted from the scan register into a serial input shift register (SISR). These steps are repeated such that each subsequent response is compressed with a previous response in the SISR wherein a signature is created in the SISR.

In another embodiment of the present invention, an electronic apparatus has a flexible built-in self test capability for generating a plurality of test vectors for application to a device within the electronic apparatus for causing the device to produce at least two parallel outputs in response to each of the plurality of test vectors. The device includes a scan register for receiving the at least two parallel outputs. The electronic apparatus further includes control logic for initializing the electronic apparatus into a test mode in response to a mode select signal applied thereto. The control logic also controls states of the device for test purposes. A test vector generator is coupled to the control logic and to the device for generating the plurality of test vectors for application to inputs of the device. The device generates the at least two parallel outputs in response to each test vector applied to its inputs. A serial input shift register (SISR) is also coupled to the control logic and to the device. In response to each test vector applied to the device, each of the at least two parallel outputs to be verified are latched into the scan register and then the contents of the scan register are serially shifted into the SISR. The SISR generates a signature from the shifted contents.

The foregoing and other objects, features, and advantages of the invention will be apparent from the following more particular description of a preferred embodiment of the invention, as illustrated in the accompanying drawing.

DETAILED DESCRIPTION

The design cycle for complex integrated circuits has been greatly improved by the use of macros that can be stored in a library such that a designer can call the macros from the library for integration into a design for performing the necessary function. Hence, the designer does not need to re-design commonly used circuits, even very complex commonly used circuits, for example, microprocessor cores, memories, digital signal processors etc. The cores are often designed as soft cores or compiled macros. These soft cores or compiled macros are designed around a base design which base may be modified according to any number of parameters from which the design depends. For example, an adder circuit may add four, eight or many other addends depending upon a parameter which defines the number of inputs. This is known as parameterizing the macro. Another common example is a memory macro, for example, a read only memory (ROM) that can be parameterized according to a number of words, as well as the number of bits making up each word, wherein the bits are accessed in parallel therefrom. When such soft macros or compiled cores are embedded within many other circuits (or macros) testing the full functionality becomes difficult.

Designers have been using built in self test (BIST) circuits that are also embedded within a system to test the otherwise difficult to verify functions. These BIST circuits generally are designed to test a specific function and with each such new function or modification of a function a new BIST circuit is designed. Design cycle time and reliability are improved by using a single BIST circuit design as a library function (only needs to be tested and proven once) that can also be parameterized in a manner that reflects the parameterization applied to the parameterized macro. By including such a parameterized BIST circuit, once the design is proven, it is included in the library of functions as a macro and can be reused with a very high degree of reliability.

Figure 1:
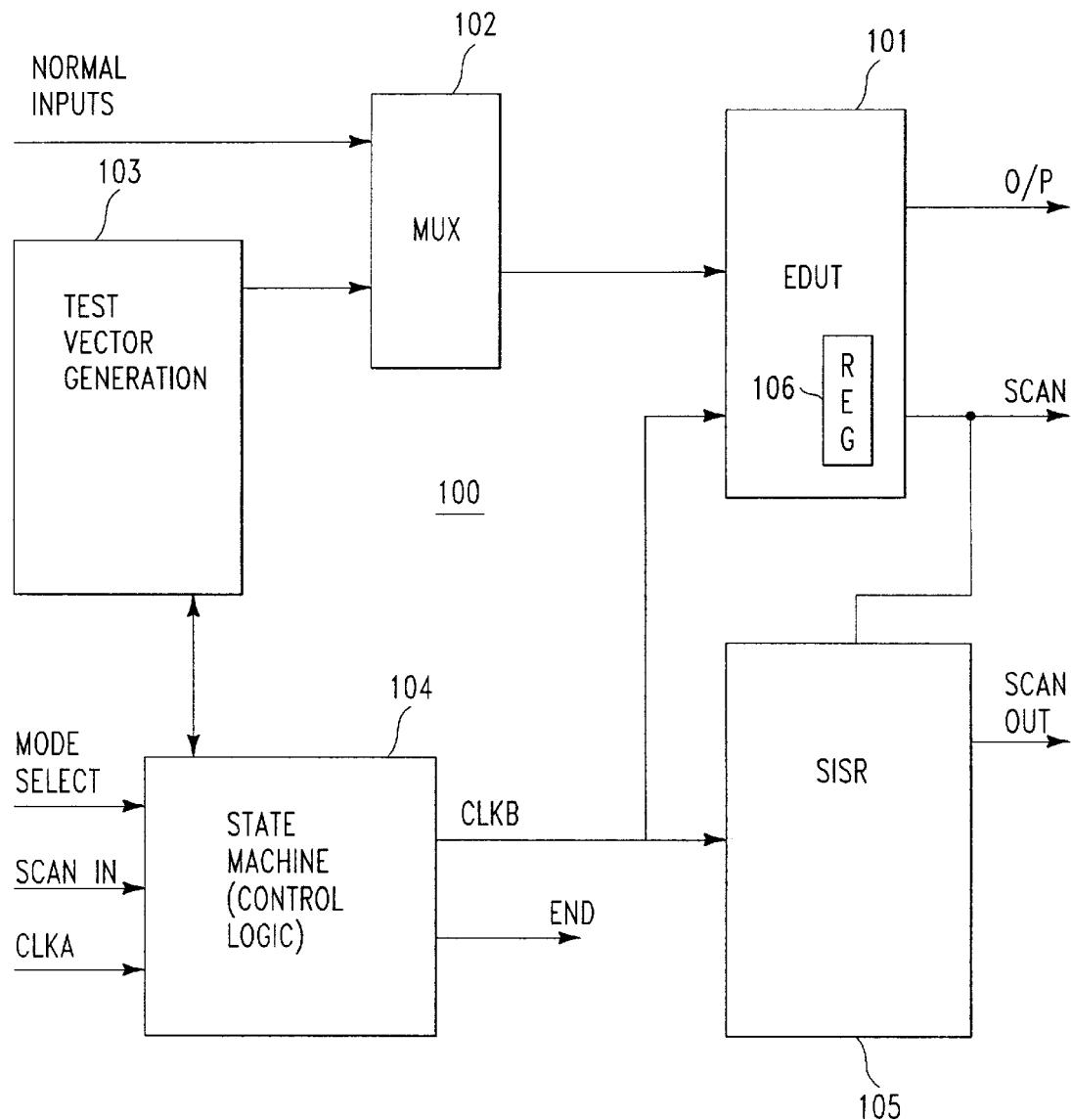
FIG. 1 is a high level block diagram depicting a built-in self test macro and an embedded device.

FIG. 1 is a high level block diagram depicting a BIST macro 100 for a parameterized circuit or embedded device 101. Generally, the BIST macro 100 includes a state machine or control logic 104, a test vector generator 103, a multiplexor 102 and a serial input shift register (SISR) 105. A mode select signal is provided to the control logic 104 for selecting one of several modes of operation, for example, normal operation, test, or burn-in test. During normal operation the BIST 100 is essentially invisible to system operation, including operation of the embedded device 101. In normal operation, the multiplexor 102 selects the normal inputs which are internal signals within the integrated circuit or system. These normal inputs are applied to the embedded device 101 and the outputs (O/P) therefrom are applied to other circuits. The scan output of the embedded device is normally disabled unless in the test mode. In one variation, the O/P signals of the embedded device 101 can be loaded into its internal register 106 and then those O/P signals can be serially provided to a single output pin for diagnostic purposes.

The embedded device 101 is tested when the mode select indicates a test mode to the control logic 104. The control logic 104 thereafter controls the several states of the BIST macro 100. As a first step, parameter data is received in the control logic 104 via the scan in lead. This parameter data describes to the BIST macro 100 how many outputs are provided in parallel from the embedded device 101 and how many inputs need to be applied in place of the normal inputs. If the embedded device 101 is a read only memory (ROM), for example, then the inputs would be all of the addresses needed to exercise the ROM.

Initially, the multiplexor 102 deselects the normal inputs and selects outputs from the test vector generator 103 for its inputs. The test vector generator 103 can take one of several forms. A pseudo random pattern generator can be used to generate the test vectors wherein a predictable, yet nearly random pattern is applied. Alternatively, a counter can be used to basically step through input test patterns sequentially. A counter works especially well when the embedded device 101 is a memory and a known set of addresses need to be generated since a large counter can be used which would work for a variety of different sized memories and a seed number can start the counter where needed for the specific memory (that is, start at the highest address and decrement to zero).

Having initialized the test vector generator 103 and selected its outputs via the multiplexor 102, the first test input is applied to the embedded device 101. Since the embedded device 101 will output several O/P signals in parallel in response to the single test input, a register 106 (or a similar structure) is needed to capture the O/P signals. The O/P signals can be loaded into the register 106 either serially or in parallel. In either case, the test vector generator 103 is held in its current state until the register 106 is loaded and its contents scanned into the SISR 105. The control logic 104 clocks the 0/P signals from the register 106 and into the SISR 105 by the CLK B signal. The sequence of test vector generation, register loading, and scanning is repeated until the necessary number of test vectors have been applied. In the end, the SISR compresses all of the received O/P signals into a single signature. This signature is subsequently compared to an expected signature of a functional embedded device to determine whether the embedded device 101 is operational.

An important aspect of the current invention is converting the parallel O/P signals into a serial stream. Generally speaking, maximum testing performance dictates that the parallel O/P signals should be analysed in parallel (that is, loaded into a multiple input shift register in parallel both for presentation of data to other logic and for conversion into a serial data stream). While the steps of latching the parallel O/P signals into a register and then serially scanning that data into a SISR appear to unnecessarily slow testing speed, the inventors of the present invention have realized that serializing the parallel O/P signals allows a single BIST circuit to work regardless of the number of parallel O/P signals and further provides for improved aliasing in the SISR by increasing selection possibilities.

First, a single BIST circuit is made possible because the number of parallel outputs (a design parameter) is scanned into the BIST 100 on the scan-in pin. Hence, if there are four parallel O/P signals, the control logic 104 will be programmed to clock the register 106 for four clocks, and concurrently the SISR for four clocks to capture all the outputs, all while the test vector generator 103 remains static. Comparatively, if there were twenty parallel O/P signals, then the control logic would provide twenty clocks to the register 106 and SISR 105 as appropriate. Therefore, regardless of the number of parallel O/P signals to be analysed, the same BIST circuit structure can effectively analyse those signals. Given that the SISR is not dependent upon the number of parallel O/P signals, a SISR having feedback turns to optimize aliasing can be chosen.

Figure 2:
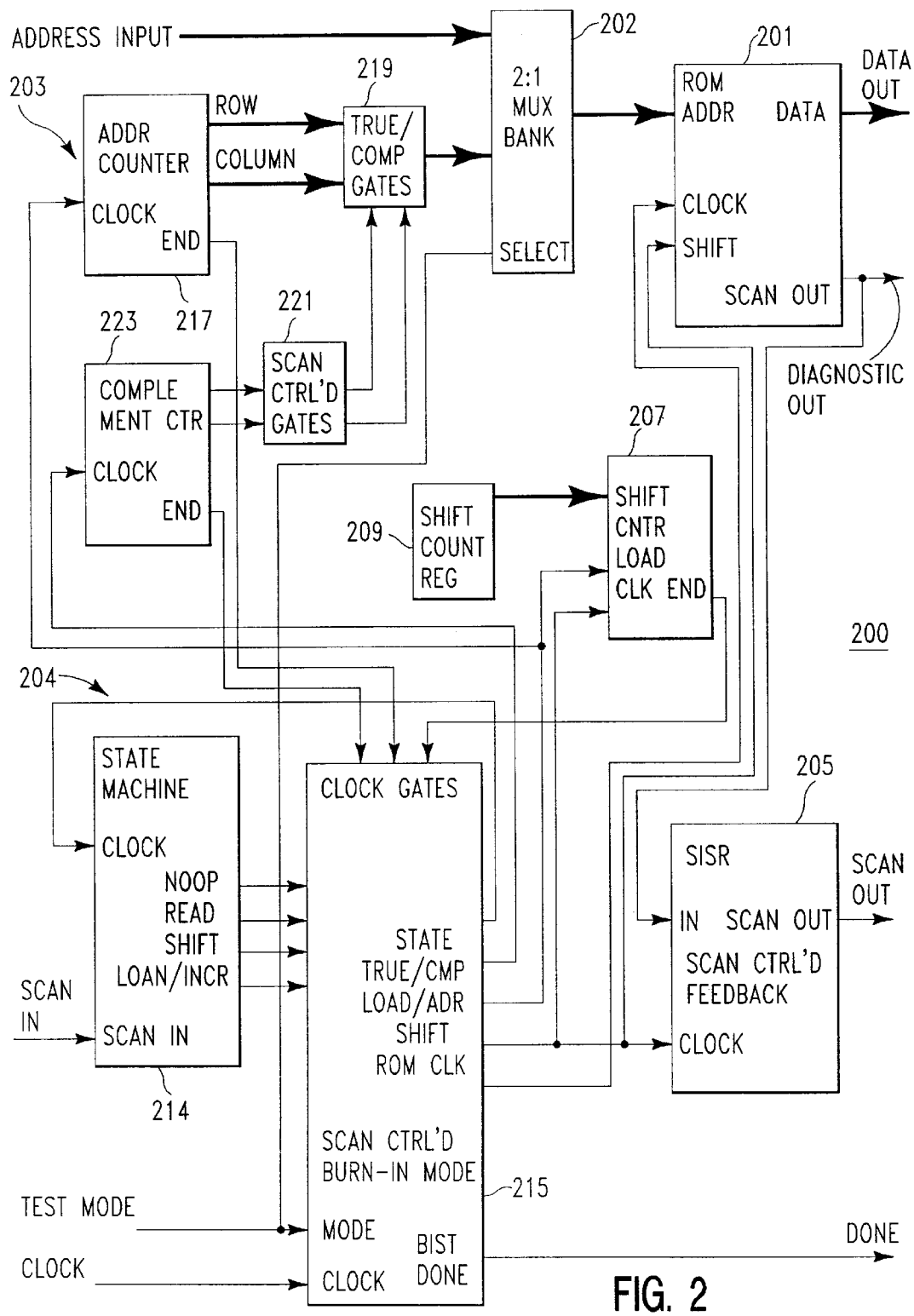
FIG. 2 is a block diagram showing greater detail of the block diagram of FIG. 1 wherein the embedded device is a compiled memory.

Referring now to FIG. 2, a more specific implementation of the present invention of a parameterized BIST circuit 200 is shown. In the specific embodiment shown, the BIST circuit 200 is used to test an embedded compiled ROM macro 201. The compiled ROM macro 201 can be varied according to input parameters defining the number of words (addresses) and the widths of the words (bits). The BIST circuit 200 is implemented as a single design sub-macro which can be used with ROMs having various number of words as well as varying number of bits in each word. Other features include the ability to compress the ROM contents into a representative small signature with minimum aliasing, the ability to run with a self contained controller (initiated by primary inputs, test completion indication and final test vector), capability of continuous cycling (burn-in), and AC test support.

Since the general operation of the BIST 200 was already described in conjunction with FIG. 1, only the details as applicable to the specific embodiment will be additionally described. Operation of the BIST circuit 200 is controlled by the control logic 204 which is made up of state machine 214 and control 215. The state machine 214 has four states, no-op, read, shift and load/increment. During the no-op (no operation) state the BIST 200 is quiescent. The read state captures the data at outputs of the compiled ROM 201 according to a currently applied target address. The load/increment state occurs each cycle to reload the shift counter 207 with the number of parallel outputs of the compiled ROM 201 from the shift count register 209 in order to count the outputs of the compiled ROM 201 to be shifted out of an internal scan register and into the SISR 205 for compression during the shift state. Additionally, the load/increment state increments the address counter 217 (or decrements in an alternative embodiment).

Test vector generator 203 includes an address counter 217, a complement counter 223, a control 221 and a true/complement circuit 219. The address counter 217 can start at address zero and increment to the last physical address of the compiled ROM 201. Alternately, the address counter 217 can be initialized with the last physical address and then decrement down to zero. The address counter 217 has a clock input connected to load/address output of the control 215. The preferred embodiment of the present invention, however, goes further than simply incrementing or decrementing through the addresses. Additionally, a pseudo AC test is performed by providing true and complement addresses for each increment or decrement of the counter 217. Outputs from the address counter 217 are split into Row and Column addresses which are inputted to the true/complement circuit 219. In turn, the true/complement circuit 219 is controlled by the control 221 in conjunction with the complement counter 223.

If it is desired to provide all four true and complement combinations of the Row and Column addresses, then the complement counter 223 will count through four cycles, 01, 10, 11 and 00, as controlled by the true/cmp output of the control 215. Other combinations can be provided, for example, such as only providing true and complement addresses as controlled by control 221. A full sequence includes the true Row address in combination with a complemented Column address at count 01 whereby control 221 causes the true/complement circuit 219 to complement only the Row addresses. Next at 10 the true Column addresses and the complemented Row addresses are provided, at 11 a both Row and Column addresses are complemented and at 00 the Row and Column addresses are allowed to pass unchanged which is the target address. Hence, for a single increment or decrement of the address counter 217, four addresses are provided to the compiled ROM 201 through the multiplexor 202. For each increment of the address counter 217 the state machine 214 stays in no-operation until the target address is supplied wherein the addressed contents of the compiled ROM 201 can be read, its outputs latched into a scan register, and the scan register contents shifted into the SISR 205 via Diagnostic Out. After the complement counter cycle has completed an end bit is sent to the control 215 to indicate that the address counter 217 is presenting the target address and a read state can be performed.

Alternatively, for each address supplied to the compiled ROM 201, whether the incremented/decremented count of the address counter 217 or some true/complement version thereof, there may be a corresponding read cycle as controlled by the control logic 204 followed by a shift cycle for compressing all portions of the AC test cycle. For purposes of the preferred embodiment, the process is described only for the target address. The shift count register 209 is initialized with a scan vector which describes the word width (number of parallel O/P signals) provided by the compiled ROM 201 during the load/increment state. During the load/increment state, the state machine 214 causes the shift counter 207 to load the word width from the shift count register 209. Afterwards, during the shift state, the shift counter 209 will increment or decrement a number of times equal to the word width to shift the Data Out signals out of the internal scan register (not shown) of the compiled ROM 201 and into the SISR 205. The internal scan register may be comprised of level sensitive scan devices or other register types as is known in the art. As previously stated, the internal scan register is loaded in parallel during the read state by capturing each Data Out signal at a corresponding register, which registers comprise the internal scan register.

After the contents of the internal scan register of the compiled ROM 201 is completely shifted out, the shift counter 207 provides an end signal to the control 215. At this time the SISR 205 has serially received each Data Output signal from the internal scan register wherein each data output signal is compressed with a preceding data output signal as it is received. The SISR 205, in the preferred embodiment, is a thirty-one bit linear feedback shift register which performs compression one bit at time or "on the fly" until a final signature is generated. Compression is performed using a given polynomial as determined by selected feedback taps. An increase in the number of bits used to build a SISR provides a corresponding reduction in the likelihood of errors. Thirty-one bits provides a reasonable compromise between silicon area required for implementation and risk of aliasing errors. A three term primitive binary polynomial exists for a thirty-one bit SISR which simplifies feedback design. For example, in the preferred embodiment, the primary polynomial is $X31+X3+1$, and the inverse polynomial is X31+X28+1. The SISR 205 is re-programmed using the inverse polynomial and the entire test is repeated. The second inverse signature is used in combination with the original signature for improved aliasing results. Those skilled in the art will recognize that other length SISRs and various other polynomials may be chosen without departing from the invention set forth herein.

The test is completed by comparing the signature or signatures to the expected results. Such comparison can result in a simple pass/fail signal indicating those results. In the event that a fail signal is received, the cause of the failure can be further pursued by using a diagnostic output of the compiled ROM 201. The diagnostic output is the same data that is supplied to the input of the SISR 205, but conveniently is provided to an output pin of the chip in a serial manner. This is especially useful for detecting structural defects causing the same failure to occur over and over. For example, having determined that a specific bit is failing by shifting data out of the diagnostic output, the signature generated thereby would be a repeated signature in other devices for that same failure.

The control 215 is also designed to provide a "burn-in" mode. In the burn-in mode the above described test is repeated a continuously. The signature is not used during the burn-in cycle. The integrated circuit may also be exposed to different environmental conditions during such cycles as is known in the art.

Method of Operation

Figure 3:
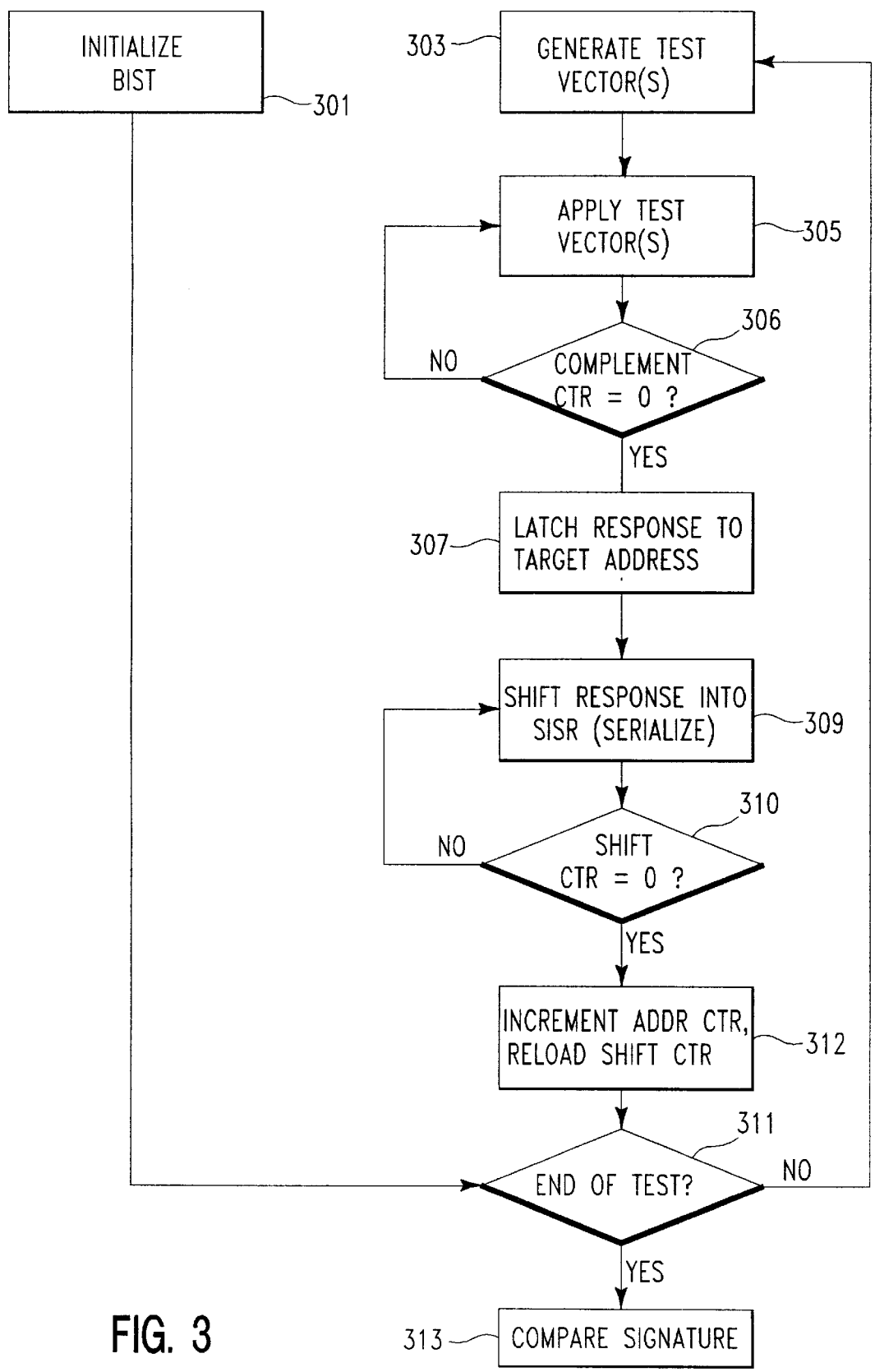
FIG. 3 is a flow diagram showing the sequence of steps occurring during a verification using the built-in self test system depicted in FIG. 1 and FIG. 2.

FIG. 3 is a flow diagram showing the basic steps for testing an embedded macro according to a preferred embodiment of the present invention. Step 301 includes initializing the BIST circuit which requires identifying the mode of operation (normal, test, burn-in, etc.) and scanning into the BIST circuit macro parameters necessary to properly test the embedded device (number of test vectors, number of parallel outputs, ac test parameters, etc.). Scanning the macro parameters into the BIST circuit allows the BIST circuit to configure itself as needed to essentially become tester matched to the embedded macro. For example, certain counts are used for initializing an address counter, a true/complement circuit, and a scan counter, according to a number of test vectors, ac tests, and a number of parallel outputs to be serialized, respectively. Having initialized the BIST circuit, a test is made to see if the test is complete at step 311 which includes determining whether an address counter overflow has occurred. Since the BIST circuit has not completed the test, step 303 is performed which includes generating a test vector or vectors. The test vector may be further modified (weighting, complementing, etc.) according to initialization parameters, and some combination of all vectors are applied to the embedded device in step 305. Assume the test vector, referred to as the target test vector, is complemented by row and column portions, then the complement counter cycles the complement circuit through the several complement combinations. At step 306 a test is made as to whether all combinations have been applied. If the complement counter equals zero then the target address vector is present and applied to the compiled ROM.

The response of the embedded device to each applied test vector is collected at step 307 in a register which, in the preferred embodiment, is an integral part of the embedded device, wherein the register has a number of stages equal to the number of parallel outputs of the embedded device. The register actually captures the data at the outputs as it is made available and such loading is controlled by the BIST circuit clocking as defined by the parameters scanned therein. If the register is instead embodied at part of the BIST circuit, then the function is the same except that the register needs to be programmably operated according to the number of parallel outputs of the embedded circuit (for example, the number of stages needs to equal the highest number of parallel outputs expected for a given embedded circuit and programmable to receive less). The process of loading the parallel outputs into a register and serially shifting the parallel outputs from the register is referred herein as "serializing" the parallel outputs.

The serializing process occurs at step 309 wherein the parallel outputs that have been loaded into the register are now clocked serially from the register and into the SISR one bit at a time. The SISR compresses each received bit with prior received bits with a test being made at step 310 as to whether the received bit is the last bit according to the shift counter. After all bits have been received, the address counter is incremented at step 312 and the shift counter is reloaded from the shift count register in preparation for the next cycle. Step 311 tests to determine whether all test vectors have been generated and applied to the embedded circuit. If not, then steps 301 through 312 are repeated until such time as all desired test vectors have been generated and applied. In the burn-in mode, the entire cycle will repeat for an extended period of time. Once end-of-test has been reached at step 311, then the SISR will hold a signature and that signature is compared to the expected signature. The BIST done signal in the control 215 is then set to indicate end of test has been reached.

While the invention has been particularly shown and described with reference to preferred embodiments thereof, it will be understood by those skilled in the art that various changes in form and details may be made therein without departing from the spirit and scope of the invention. For example, the embedded devices could vary substantially and could itself include test scan registers for testing sequential logic. Nor is the invention meant to be limited to ROMs, but is extendable to other types of memories as well. The selection of a thirty-one bit SISR in the preferred embodiment is a design choice and other length SISRs and as well as other polynomial choices can be made. Changes in future embodiments of the invention can therefore be made without departing from the teachings herein.

What is claimed is:

1. In an integrated circuit chip a method of using a built-in self test circuit for testing an embedded macro circuit on said chip having parallel outputs, said method comprising the steps of:

(a) initializing said chip into a test mode of operation;
   (b) generating a test vector in said built-in self test circuit,
   (c) applying said test vector to inputs of said embedded macro circuit causing said embedded macro circuit to generate a response on the parallel outputs;
   (d) loading said response into a scan register;
   (e) serially shifting said response from said scan register into a serial input shift register (SISR); and
   (f) repeating steps (b) through (e) such that each subsequent response is serially compressed with a previous response in said SISR resulting in a signature of said each response in said SISR.

2. The method according to claim 1 further comprising a step (g) comparing the signature to a predetermined signature known to represent a fully functional embedded macro circuit.

3. The method according to claim 2 wherein said step (d) loading the scan register is performed by latching said response into the scan register by clocking said scan register such that each output of said parallel outputs is latched in parallel.

4. The method according to claim 2 wherein said step (b) generating a test vector includes complementing portions of said test vector prior to applying a target test vector.

5. The method according to claim 2 wherein said test vector of step (b) is generated pseudo randomly.

6. The method according to claim 2 wherein said test vector of step (b) is generated predictably by stepping a counter.

7. The method according to claim 1 further comprising a step (h) burn-in mode, wherein said steps (b) through (g) are repeated a predetermined number of times under varying environmental conditions for stressing the embedded circuit under burn-in mode conditions.

8. An integrated circuit chip having a flexible built-in self test capability for generating a plurality of test vectors for application to a device within said chip for causing said device to produce at least two parallel outputs in response to each of said plurality of test vectors, said device including a scan register for receiving said at least two parallel outputs, said chip comprising:

control logic for initializing said chip into a test mode in response to a mode select signal applied thereto, said control logic further controlling states of the device for test purposes;

a test vector generator coupled to said control logic and to said device for generating said plurality of test vectors for application to inputs of said device, wherein said device generates said at least two parallel outputs in response to each test vector of said plurality of test vectors; and a serial input shift register (SISR) coupled to said control logic and to said device wherein said control logic instructs said device to latch each said at least two parallel outputs to be verified into said scan register and then serially shift contents of said scan register into said SISR for each test vector, said SISR generating a signature from said shifted contents.

9. The electronic apparatus according to claim 8 wherein said test vector generator comprises a linear feedback shift register for generating said plurality of test vectors pseudo-randomly.

10. The electronic apparatus according to claim 8 wherein said test vector generator comprises a counter for sequentially generating said plurality of test vectors.

11. The electronic apparatus according to claim 10 wherein said device is a memory device and said test vector generator generates addresses for causing data in said memory to appear at said at least two parallel outputs.

12. An integrated circuit having a plurality of circuits thereon, including an embedded circuit having a plurality of inputs and a plurality of outputs not directly accessible by I/O pads of said integrated circuit, said embedded circuit having a scan register for serializing said plurality of outputs, said integrated circuit further comprising a built-in self test circuit for verifying proper operation of said embedded circuit, said built-in self test circuit comprising:

control logic for controlling a plurality of states of said built-in self test circuit and said embedded circuit, said plurality of states including a test vector state, a load state, and a shift state;

a test generator coupled to said control logic for generating a test vector when said control logic is in said test vector state wherein each said test vector is input to said embedded circuit; and a serial input shift register coupled to said control logic and coupled to said scan register of said embedded circuit for scanning in said serialized outputs from said scan register when said control logic causes said shift state, wherein a number of said parallel outputs is for determining a number of shifts is provided during said load state, and said serial input shift register generating a signature from said serialized outputs.

13. The integrated circuit according to claim 12 wherein said control logic further includes a burn-in state wherein said embedded circuit is repeatedly cycled through said verification.

14. The integrated circuit according to claim 12 wherein said embedded circuit is a compiled memory having parameterized addresses and parallel outputs.

15. The integrated circuit according to claim 14 wherein said test generator comprises a counter wherein said counter is preloaded with a seed number from said control logic such that a number of counts of said counter is equal to the paramaterized number of addresses.

16. An integrated circuit having a plurality of circuits thereon and a plurality of input/output pads, said integrated circuit comprising:

a compiled read only memory embedded within said integrated circuit having address inputs and parallel data outputs wherein said addresses inputs and said parallel data outputs are not directly accessible by said plurality of input/output pads, said compiled read only memory including a scan register for serializing data from said parallel data outputs;

an address generator for generating each address of said compiled read only memory, said address generator comprising:

an address counter for generating row and column addresses, said address counter able to count more addresses than available in said compiled read only memory, said address counter being incremented or decremented from a predetermined start number;

a true/complement circuit coupled for receiving said row and column addresses from said address counter for providing to the compiled read only memory combinations of a true row address, a true column address, a complemented row address and a complemented column address a complement counter for controlling those true/complement combinations to be applied to said address inputs; and a multiplexer coupled for selectively receiving addresses from said integrated circuit or true/complement row and column addresses from said true/complement circuit for application to said compiled read only memory;

a shift counter programmed to count a number of parallel outputs available from said compiled read only memory, said shift counter scanning each output of said parallel outputs out of said scan register for each address applied to said compiled read only memory;

a serial input shift register coupled for receiving the contents from said scan register as each output of said parallel outputs is shifted out; and a state machine coupled for controlling states necessary for testing said compiled read only memory, said state machine receiving programming data defining parameters of said compiled read only memory including a number of addresses locations and a number of parallel data outputs.

* * * * *